United States Patent
Uesaka

(10) Patent No.: US 11,916,542 B2
(45) Date of Patent: Feb. 27, 2024

(54) ACOUSTIC WAVE FILTER DEVICE AND MULTIPLEXER USING SAME

(71) Applicant: Murata Manufacturing Co., Ltd., Nagaokakyo (JP)

(72) Inventor: Kenichi Uesaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 537 days.

(21) Appl. No.: 17/178,301

(22) Filed: Feb. 18, 2021

(65) Prior Publication Data

US 2021/0281244 A1  Sep. 9, 2021

(30) Foreign Application Priority Data

Mar. 6, 2020 (JP) ................................ 2020-039102

(51) Int. Cl.
*H03H 9/64* (2006.01)
*H03H 9/25* (2006.01)
*H03H 9/72* (2006.01)

(52) U.S. Cl.
CPC ............ *H03H 9/6413* (2013.01); *H03H 9/25* (2013.01); *H03H 9/6483* (2013.01); *H03H 9/72* (2013.01)

(58) Field of Classification Search
CPC .......... H03H 9/25; H03H 9/64; H03H 9/6413; H03H 9/6483; H03H 9/145; H03H 9/72
See application file for complete search history.

(56) References Cited

U.S. PATENT DOCUMENTS

| | | | | |
|---|---|---|---|---|
| 8,339,221 | B2* | 12/2012 | Takamine | H03H 9/14535 333/195 |
| 8,736,402 | B2* | 5/2014 | Takamine | H03H 9/14582 333/195 |
| 9,019,040 | B2* | 4/2015 | Takamine | H03H 9/6483 333/195 |
| 10,177,738 | B2* | 1/2019 | Miyamoto | H03H 9/25 |
| 10,340,884 | B2* | 7/2019 | Bergmann | H03H 9/14588 |
| 10,812,050 | B2* | 10/2020 | Takamine | H03H 9/25 |
| 10,840,881 | B2* | 11/2020 | Takigawa | H03H 9/02559 |
| 10,840,888 | B2* | 11/2020 | Takata | H03H 9/02818 |
| 11,012,052 | B2* | 5/2021 | Takamine | H03H 9/64 |

(Continued)

FOREIGN PATENT DOCUMENTS

| | | |
|---|---|---|
| JP | 2004343573 A | 12/2004 |
| JP | 2019-009583 A | 1/2019 |

(Continued)

OTHER PUBLICATIONS

Office Action in JP2020-039102, dated Aug. 30, 2022, 4 pages.

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave filter device includes first and second terminals, an inductor connected to the first terminal, and a longitudinally coupled resonator coupled between the inductor and the second terminal. The longitudinally coupled resonator includes at least one first IDT electrode coupled to the first terminal, and at least one second IDT electrode connected to the second terminal. A total capacitance value of the at least one first IDT electrode is greater than a total capacitance value of the at least one second IDT electrode.

18 Claims, 9 Drawing Sheets

(56) References Cited

U.S. PATENT DOCUMENTS

2004/0233018 A1* 11/2004 Watanabe ............ H03H 9/0085
                                                    333/195
2017/0085248 A1*  3/2017 Miyamoto ............... H03H 9/64
2018/0375496 A1  12/2018 Takamine
2020/0403604 A1  12/2020 Tani
2021/0281245 A1*  9/2021 Uesaka .................... H03H 9/25

FOREIGN PATENT DOCUMENTS

WO      2015190178 A1   12/2015
WO      2019/172032 A1   9/2019

* cited by examiner

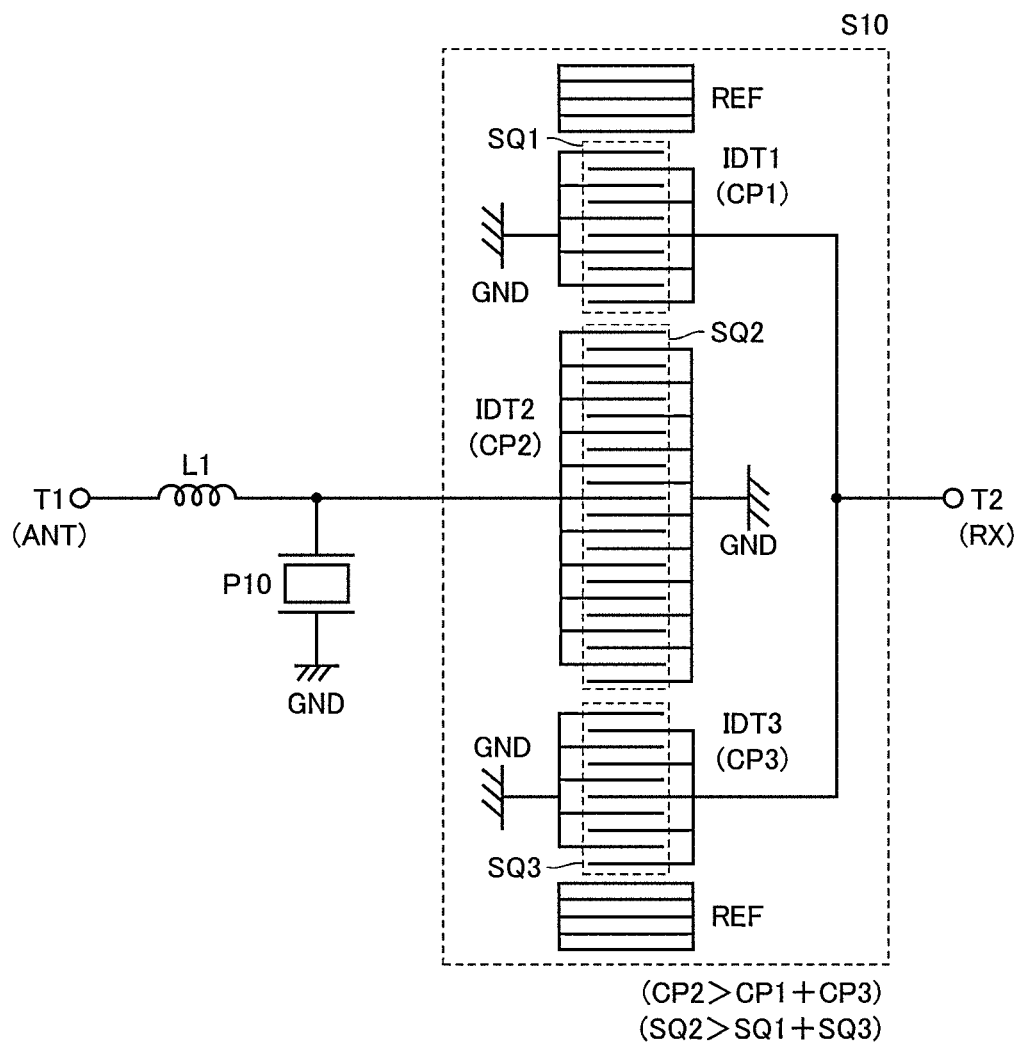

|  | REFLECTOR | IDT1A | IDT2A | IDT3A | REFLECTOR |
|---|---|---|---|---|---|
| WAVELENGTH λ [μm] (=2PT) | 1.761 | 1.733 | 1.7091 | 1.733 | 1.761 |
| ELECTRODE-FINGER SPACING GP [μm] | — | 0.433 | 0.427 | 0.433 | — |
| NUMBER OF PAIRS FOR IDT | 10.5 | 19 | 61 | 19 | 10.5 |
| NUMBER OF ELECTRODE FINGERS OF | 22 | 39 | 123 | 39 | 22 |

FIG. 8

| | IDT1B | | | IDT2B | | IDT3B | | |
|---|---|---|---|---|---|---|---|---|
| | REFLECTOR | MAIN | NARROW PITCH | NARROW PITCH | MAIN | NARROW PITCH | NARROW PITCH | MAIN | REFLECTOR |
| WAVELENGTH λ [μm] (=2PT) | 1.761 | 1.733 | 1.5884 | 1.6125 | 1.7091 | 1.6125 | 1.5884 | 1.733 | 1.761 |
| ELECTRODE-FINGER SPACING GP [μm] | — | 0.433 | — | — | 0.427 | — | — | 0.433 | — |
| NUMBER OF PAIRS FOR IDT | 10.5 | 16.5 | 2.5 | 4 | 53 | 4 | 2.5 | 16.5 | 10.5 |
| NUMBER OF ELECTRODE FINGERS OF IDT | 22 | 34 | 6 | 9 | 107 | 9 | 6 | 34 | 22 |

ACOUSTIC WAVE FILTER DEVICE AND MULTIPLEXER USING SAME

CROSS REFERENCE TO RELATED APPLICATIONS

This application claims the benefit of priority to Japanese Patent Application No. 2020-039102 filed on Mar. 6, 2020. The entire contents of this application are hereby incorporated herein by reference.

BACKGROUND OF THE INVENTION

1. Field of the Invention

The present disclosure relates to an acoustic wave filter device and a multiplexer including the acoustic wave filter device, and more specifically, to a technology to reduce or prevent the degradation of characteristics of an acoustic wave filter device including a longitudinally coupled resonator.

2. Description of the Related Art

An acoustic wave filter is used as a filter device for transmitting and receiving a signal of a desired frequency band in a portable communication device, a typical example of which is a mobile phone or a smartphone. For example, in International Publication No. 2019/172032, a multiplexer is disclosed in which two surface acoustic wave filters whose pass bands differ from each other are connected to a common terminal. The multiplexer in International Publication No. 2019/172032 has a structure in which one of the filters includes a longitudinally coupled resonator and a series inductor providing phase adjustment is arranged between the longitudinally coupled resonator and the common terminal.

In the acoustic wave filter device described above, in order to prevent a signal outside the desired frequency band from passing therethrough, it is necessary to make the phase of reflection characteristics approach that of an open state by increasing the impedance for signals of a frequency band outside the pass band when the acoustic wave filter device is viewed from an input terminal.

For example, in a case where a first acoustic wave filter device and a second acoustic wave filter device are connected to a common terminal to form a multiplexer, it is necessary to prevent a signal corresponding to the pass band of the second acoustic wave filter device from passing through the first acoustic wave filter device. In addition, even in a case where an acoustic wave filter is used by itself, it is necessary to prevent a signal included in an input radio frequency signal but outside the desired pass band from passing therethrough.

To deal with such an issue, there may be a case where impedance matching is achieved by connecting an inductor in series between the common terminal and the filter as disclosed in International Publication No. 2019/172032. Here, the impedance viewed from the input terminal is determined by the impedance of the inductor and the impedance of the input side of the acoustic wave filter device itself. Generally, an acoustic wave filter has capacitive impedance. In a case where phase adjustment is performed using a series inductor, when the phase of an acoustic wave filter is apart from that of a short-circuit state, the inductance of the inductor needs to be increased. However, when the inductance of the series inductor is increased, the insertion loss increases due to an increase in the resistive component, which may degrade bandpass characteristics.

SUMMARY OF THE INVENTION

Preferred embodiments of the present invention provide acoustic wave filter devices in each of which an impedance for signals outside a pass band is maintained while reducing or preventing an increase in insertion loss.

An acoustic wave filter device according to a preferred embodiment of the present invention includes a first terminal, a second terminal, an inductor connected to the first terminal, and a longitudinally coupled resonator coupled between the inductor and the second terminal. The longitudinally coupled resonator includes at least one first IDT electrode coupled to the first terminal, and at least one second IDT electrode connected to the second terminal. A total capacitance value of the at least one first IDT electrode is greater than a total capacitance value of the at least one second IDT electrode.

An acoustic wave filter device according to another preferred embodiment of the present disclosure includes a first terminal, a second terminal, an inductor connected to the first terminal, and a longitudinally coupled resonator coupled between the inductor and the second terminal. The longitudinally coupled resonator includes at least one first IDT electrode coupled to the first terminal, and at least one second IDT electrode connected to the second terminal. A total area of an intersecting region of electrode fingers of the at least one first IDT electrode is larger than a total area of an intersecting region of electrode fingers of the at least one second IDT electrode.

In an acoustic wave filter device according to a preferred embodiment of the present disclosure, an inductor is connected in series between a first terminal and a longitudinally coupled resonator, and the total capacitance value (or the total area of an intersecting region of electrode fingers) of an IDT electrode or IDT electrodes on the input side (a first-terminal side) of the longitudinally coupled resonator is set to be larger than the total capacitance value (or the total area of an intersecting region of electrode fingers) of an IDT electrode or IDT electrodes on the output side (a second-terminal side) of the longitudinally coupled resonator. With this configuration, the inductance of the inductor can be relatively reduced, and the resistive component of the inductor can be reduced. Thus, in each of the acoustic wave filter devices of preferred embodiments of the present invention, the impedance for signals outside the pass band can be maintained while reducing or preventing an increase in the insertion loss.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a diagram for describing details of the acoustic wave filter device according to the first preferred embodiment the present invention.

FIG. 8 is a diagram illustrating an example of parameters for a longitudinally coupled resonator in FIG. 7.

DETAILED DESCRIPTION OF THE PREFERRED EMBODIMENTS

Figure 1:
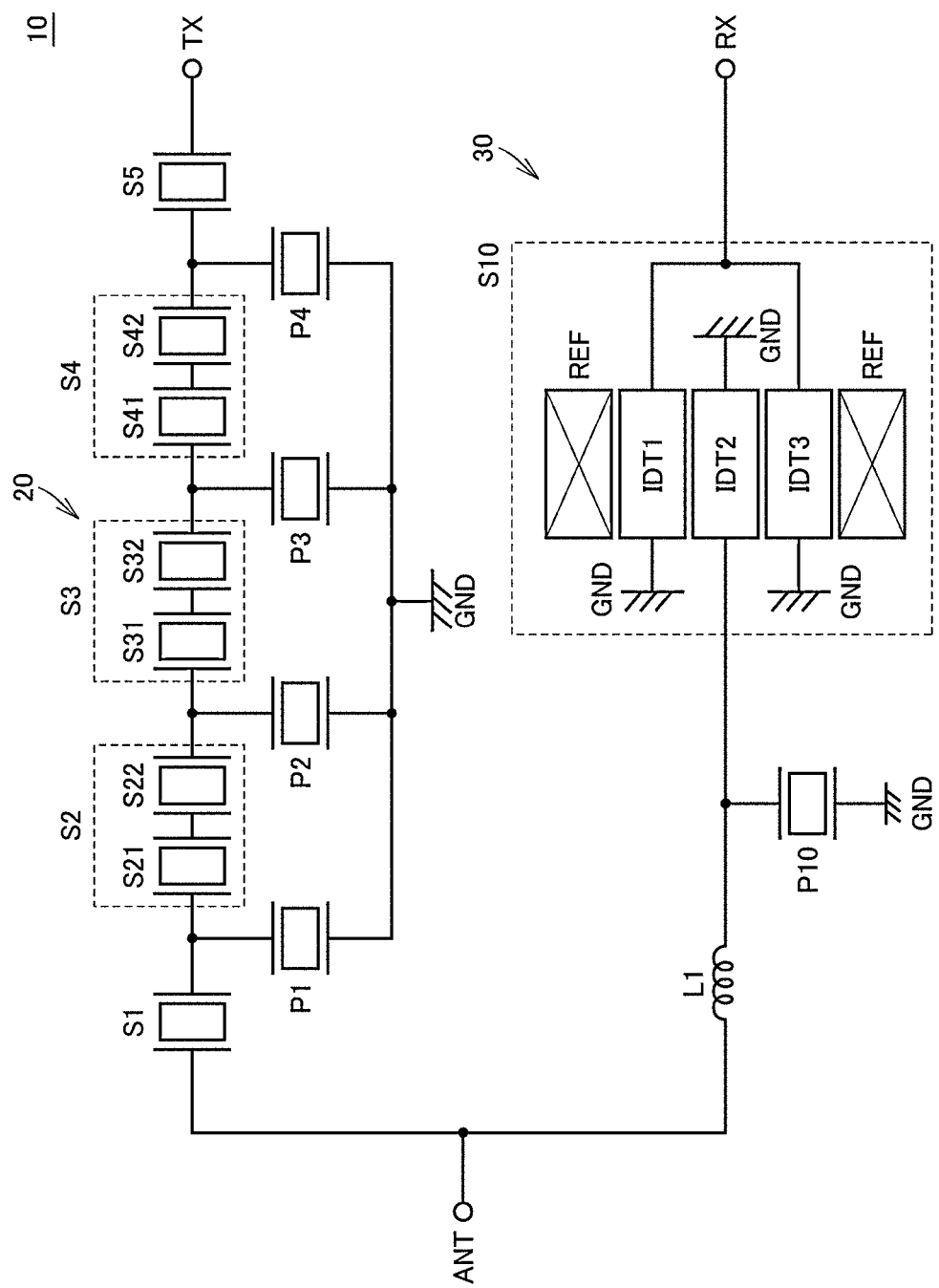
FIG. 1 is a diagram illustrating a circuit configuration of a multiplexer including an acoustic wave filter device according to a first preferred embodiment of the present invention.

In the following, preferred embodiments of the present disclosure will be described in detail with reference to the drawings. Note that the same or substantially the same portions are denoted by the same reference numerals and the description thereof will not be repeated.

First Preferred Embodiment

Configuration of Multiplexer

FIG. 1 is a diagram illustrating a circuit configuration of a multiplexer 10 including an acoustic wave filter device 30 according to a first preferred embodiment of the present invention. The multiplexer 10 further includes an acoustic wave filter device 20 in addition to the acoustic wave filter device 30. Note that, in the following description, "acoustic wave filter device" may also be simply referred to as "filter device".

With reference to FIG. 1, the multiplexer 10 is an acoustic wave filter device used in, for example, a transmission-reception circuit of a communication device. The filter device 20 is provided between an antenna terminal ANT (a first terminal) and a transmission terminal TX (a third terminal), and the filter device 30 is provided between the antenna terminal ANT and a reception terminal RX (a second terminal). The filter device 20 is a band pass filter that treats the frequency band of a transmission signal as a pass band. The filter device 30 is a band pass filter that treats the frequency band of a signal received by an antenna (not illustrated) as a pass band.

The filter device 20 for transmission is a ladder filter including series arm resonance units S1 to S5 connected in series between the antenna terminal ANT and the transmission terminal TX and parallel arm resonance units P1 to P4. A resonance portion of each of the series arm resonance units S1 to S5 and the parallel arm resonance units P1 to P4 preferably includes at least one acoustic wave resonator, for example. In the example in FIG. 1, each resonance portion of the series arm resonance units S1 and S5 and the parallel arm resonance units P1 to P4 preferably includes one acoustic wave resonator, for example, and each resonance portion of the series arm resonance units S2 to S4 preferably includes two acoustic wave resonators, for example. The series arm resonance unit S2 includes acoustic wave resonators S21 and S22 connected in series. The series arm resonance unit S3 includes acoustic wave resonators S31 and S32 connected in series. The series arm resonance unit S4 includes acoustic wave resonators S41 and S42 connected in series. Note that the number of acoustic wave resonators included in each resonance portion is not limited to this and may be selected as appropriate in accordance with the characteristics of the filter device. As the acoustic wave resonators, for example, a surface acoustic wave (SAW) resonator in which interdigital transducer (IDT) electrodes are provided on a piezoelectric substrate can be used.

One end of the parallel arm resonance unit P1 is connected to a connection point between the series arm resonance unit S1 and the series arm resonance unit S2, and the other end of the parallel arm resonance unit P1 is connected to a ground potential GND. One end of the parallel arm resonance unit P2 is connected to a connection point between the series arm resonance unit S2 and the series arm resonance unit S3, and the other end of the parallel arm resonance unit P2 is connected to the ground potential GND. One end of the parallel arm resonance unit P3 is connected to a connection point between the series arm resonance unit S3 and the series arm resonance unit S4, and the other end of the parallel arm resonance unit P3 is connected to the ground potential GND. One end of the parallel arm resonance unit P4 is connected to a connection point between the series arm resonance unit S4 and the series arm resonance unit S5, and the other end of the parallel arm resonance unit P4 is connected to the ground potential GND.

The filter device 30 for reception includes a series arm resonance unit S10, a parallel arm resonance unit P10, and an inductor L1. The inductor L1 and the series arm resonance unit S10 are connected in series between the antenna terminal ANT (a first terminal T1) and the reception terminal RX (a second terminal T2). The parallel arm resonance unit P10 is connected between a connection node between the inductor L1 and the series arm resonance unit S10 and the ground potential GND.

The parallel arm resonance unit P10 preferably includes, for example, one acoustic wave resonator. The series arm resonance unit S10 is a longitudinally coupled resonator acoustic wave resonator and includes three IDT electrodes IDT1 to IDT3 and reflectors REF.

One end of the inductor L1 is connected to the antenna terminal ANT, which is a common terminal shared with the filter device 20. The IDT electrode IDT2 of the series arm resonance unit S10 is connected between the other end of the inductor L1 and the ground potential GND.

The IDT electrode IDT1 faces one end of the IDT electrode IDT2 in an excitation direction, and the IDT electrode IDT3 faces the other end of the IDT electrode IDT2 in the excitation direction. The IDT electrodes IDT1 and IDT3 are connected in parallel between the reception terminal RX and the ground potential GND. The reflectors REF are arranged at the sides of the IDT electrodes IDT1 and IDT3 where the IDT electrode IDT2 is not provided so as to face the IDT electrodes IDT1 and IDT3 in the excitation direction.

The inductor L1 defines and functions as an inductor providing impedance matching. The inductance of the inductor L1 is adjusted such that the impedance obtained when the filter device 30 is viewed from the antenna terminal ANT is infinite for radio frequency signals of the pass band of the filter device 20. Consequently, passing of the radio frequency signals of the pass band of the filter device 20 to the reception terminal RX side can be reduced or prevented.

Configuration of Filter Device 30

FIG. 2 is a diagram for describing details of the filter device 30 in FIG. 1. As described above, the filter device 30 is provided between the antenna terminal ANT (the first terminal T1) and the reception terminal RX (the second terminal T2).

The IDT electrodes provided on the piezoelectric substrate in the series arm resonance unit S10 each include a plurality of electrode fingers that are interdigitated with each other. That is, each IDT electrode can define and function as a capacitor. Here, when the IDT electrodes IDT1, IDT2, and IDT3 have a capacitance CP1, a capacitance CP2, and a capacitance CP3, respectively, the capacitance CP2 of the IDT electrode IDT2 is designed to be higher than the sum of the capacitance CP1 of the IDT electrode IDT1 and the capacitance CP3 of the IDT electrode IDT3 (CP2>CP1+CP3). Here, in each of the IDT electrodes IDT1 to IDT3, the intersecting region indicates a region where a plurality of electrode fingers of the IDT electrode overlap each other when viewed from the acoustic wave propagation direction. The area of the intersecting region is expressed by, for example, the product of the number of pairs of electrode fingers included in the intersecting region and an intersecting width.

More specifically, the total number of electrode fingers of the IDT electrode IDT2 is set to be greater than the sum of the number of electrode fingers of the IDT electrode IDT1 and the number of electrode fingers of the IDT electrode IDT3.

Consequently, in a case where the area of an intersecting region of the electrode fingers of the IDT electrode IDT1, that of the IDT electrode IDT2, and that of the IDT electrode IDT3 are denoted by SQ1, SQ2, and SQ3, respectively, SQ2>SQ1+SQ3.

In the multiplexer illustrated in FIG. 1, it is preferable that the phase of reflection characteristics with respect to the frequency band of the transmission signal is that of an open state when the filter device 30 is viewed from the antenna terminal ANT in order to prevent the transmission signal from passing through the filter device 30 on the reception side when radio waves are radiated from the filter device 20 on the transmission side through the antenna. In the filter device 30, the inductor L1 is between the antenna terminal ANT and the series arm resonance unit S10 in order to adjust the impedance.

Generally, an acoustic wave filter has capacitive impedance. In a case where phase adjustment is performed using a series inductor, when the phase of an acoustic wave filter is spaced apart from that of a short-circuit state, the inductance of the inductor needs to be increased. However, when the inductance of the series inductor is increased, the insertion loss increases due to an increase in the resistive component. Thus, in a case where phase adjustment is performed using a series inductor, it is preferable that the inductance is as low as possible.

Figure 3B:
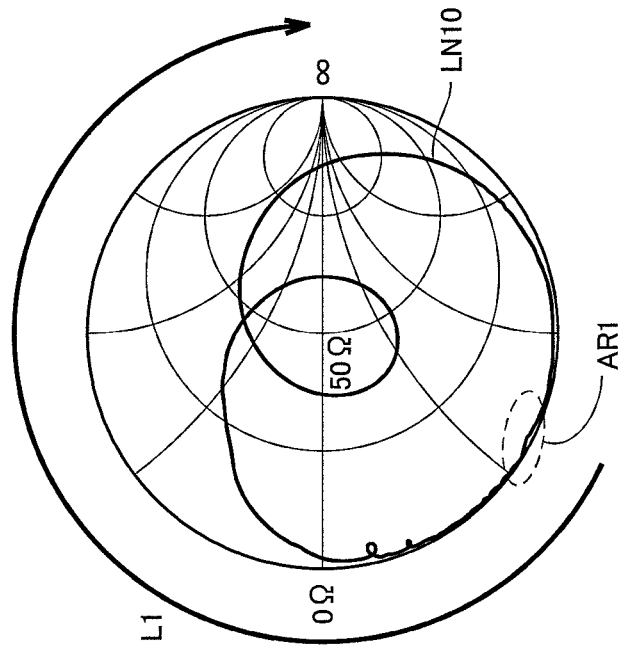
FIG. 3B is a Smith chart for describing inductance with respect to the impedance of the acoustic wave filter device according to the first preferred embodiment the present invention.
Figure 3A:
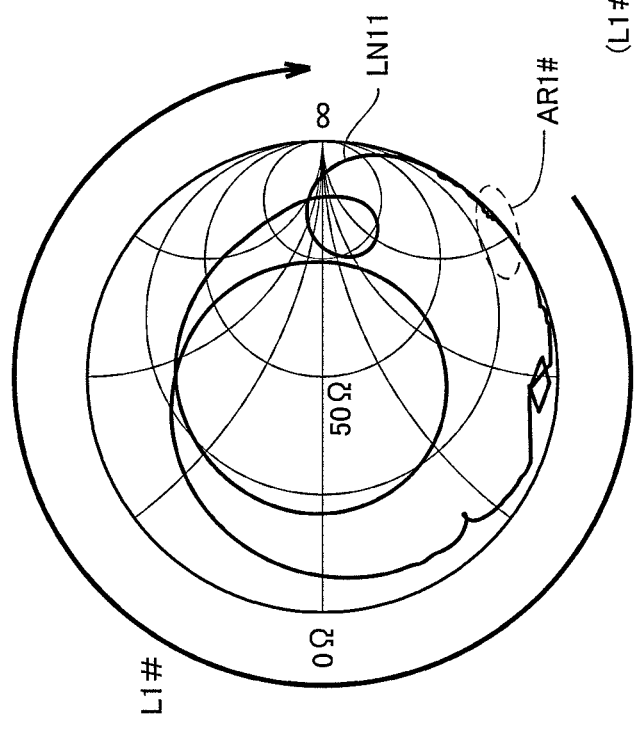
FIG. 3A is a Smith chart for describing inductance with respect to the impedance of an acoustic wave filter device according to a comparative example.

FIG. 3A is a Smith chart for describing inductance with respect to the impedance of an acoustic wave filter device according to a comparative example, and FIG. 3B is a Smith chart for describing inductance with respect to the impedance of the acoustic wave filter device according to the first preferred embodiment. Here, the inductance of the acoustic wave filter of the comparative example (FIG. 3A) is denoted by L1 #, and the inductance of the acoustic wave filter of the first preferred embodiment (FIG. 3B) is denoted by L1 (L1 #>L1). Lines LN10 and LN11 in the Smith charts in FIGS. 3A and 3B each illustrate frequency characteristics of the impedance of a circuit that does not include an inductor.

In a case where the phase of impedance is changed in a capacitive region, which is in the lower half of each Smith chart, by a series inductor, the phase rotates clockwise, and the higher the inductance of the inductor, the larger the amount of phase rotation. In other words, the lower the inductance of the series inductor, the smaller the amount of phase rotation. Thus, in order to make the phase of impedance match that of the open state by using a series inductor having a low inductance, the phase of impedance with respect to a frequency band of a target filter device in the circuit subsequent to the inductor needs to be as close as possible to a short-circuit state (0Ω) as in a region AR1 of FIG. 3B. That is, the capacitance of the input side, which is connected to the series inductor, needs to be as high as possible in the longitudinally coupled resonator acoustic wave resonator in the series arm resonance unit S10.

As described above, in the longitudinally coupled resonator acoustic wave resonator of the series arm resonance unit S10 in the filter device 30 of the first preferred embodiment, the capacitance of the IDT electrode IDT2, which is connected to the inductor L1, is set to be higher than the sum of the capacitance of the IDT electrode IDT1 and the capacitance of the IDT electrode IDT3. Thus, the inductance of the inductor L1 can be made lower than in the case where the capacitance of the IDT electrode IDT2 is lower than the sum of the capacitances of the other IDT electrodes, thus reducing the resistive component of the inductor L1. Consequently, the insertion loss of the filter device can be reduced.

Note that, in a case where a filter device includes a plurality of IDT electrodes coupled to the antenna terminal ANT on the input side as will be described in a modification of a preferred embodiment of the present invention, the filter device may have a configuration in which the number of electrode fingers included in each IDT electrode on the input side is greater than the number of electrode fingers of each IDT electrode connected to the reception terminal on the output side (that is, the number of electrode fingers of each IDT electrode on the input side is greater than the number of electrode fingers of any IDT electrode on the output side). Alternatively, in a case where a filter device includes a plurality of IDT electrodes on the input side, the filter device may have a configuration in which the plurality of IDT electrodes include at least one IDT electrode that includes a number of electrode fingers greater than the number of electrode fingers of each IDT electrode on the output side (that is, on the input side, the IDT electrodes include an IDT electrode that includes a number of electrode fingers greater than the number of electrode fingers of any IDT electrode on the output side).

Second Preferred Embodiment

In the first preferred embodiment, the configuration has been described in which the capacitance of the IDT electrode coupled to the antenna terminal is increased based on the number of electrode fingers of the IDT electrode. In a second preferred embodiment of the present invention, a configuration will be described in which the capacitance of an IDT electrode coupled to the antenna terminal is increased based on a spacing between electrode fingers of the IDT electrode.

Figure 4:
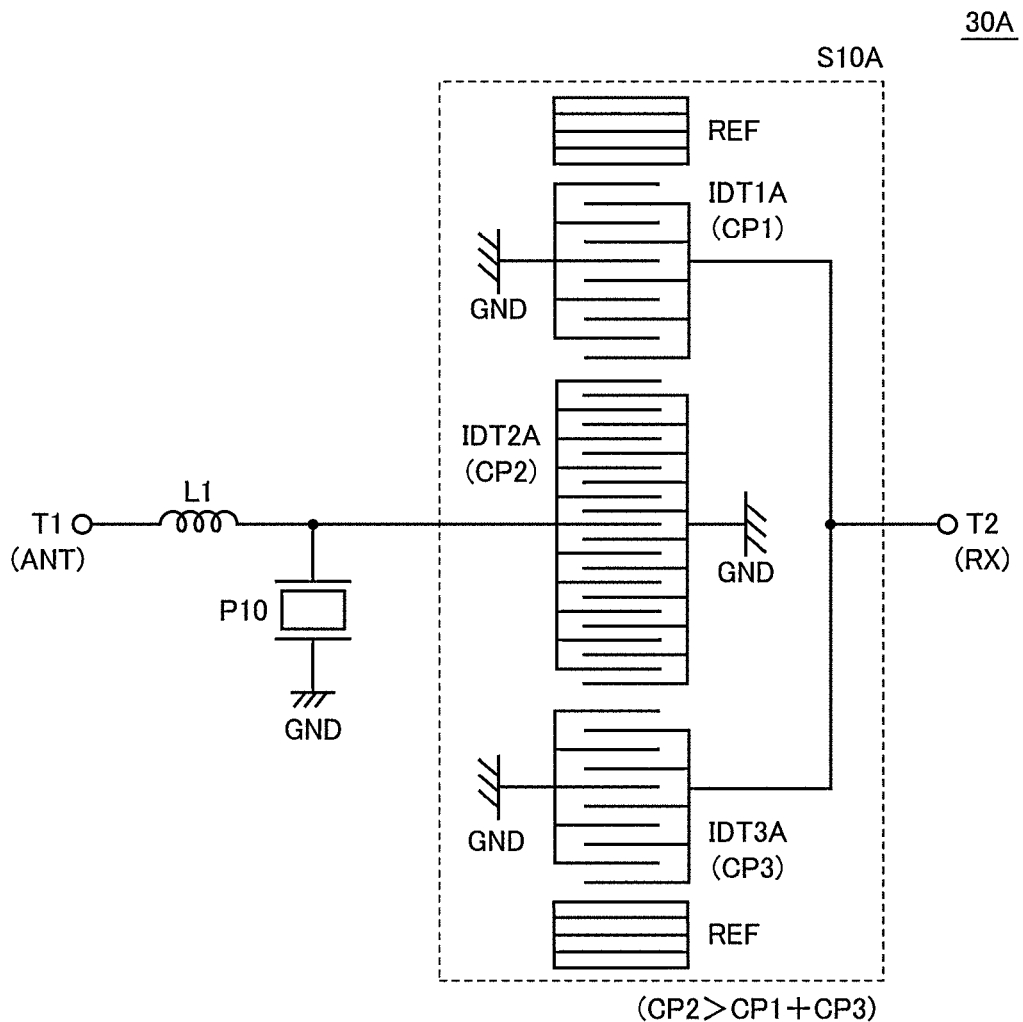
FIG. 4 is a diagram for describing an acoustic wave filter device according to a second preferred embodiment the present invention.

FIG. 4 is a diagram for describing an acoustic wave filter device 30A according to the second preferred embodiment. In the filter device 30A, the series arm resonance unit S10 in FIG. 2 is replaced with a series arm resonance unit S10A. In the filter device 30A, the description of the same or corresponding elements as those in FIG. 2 will not be repeated.

With reference to FIG. 4, similarly to the series arm resonance unit S10 in FIG. 2, the series arm resonance unit S10A is a longitudinally coupled resonator acoustic wave resonator and includes three IDT electrodes IDT1A to IDT3A and reflectors REF.

The IDT electrode IDT2A is connected between the inductor L1 connected to the antenna terminal ANT and the ground potential GND. The IDT electrode IDT1A faces one end of the IDT electrode IDT2A in an excitation direction, and the IDT electrode IDT3A faces the other end of the IDT electrode IDT2A in the excitation direction. The IDT electrodes IDT1A and IDT3A are connected in parallel between the reception terminal RX and the ground potential GND. The reflectors REF are arranged at the sides of the IDT electrodes IDT1A and IDT3A where the IDT electrode IDT2A is not provided so as to face the IDT electrodes IDT1A and IDT3A in the excitation direction.

Figure 5:
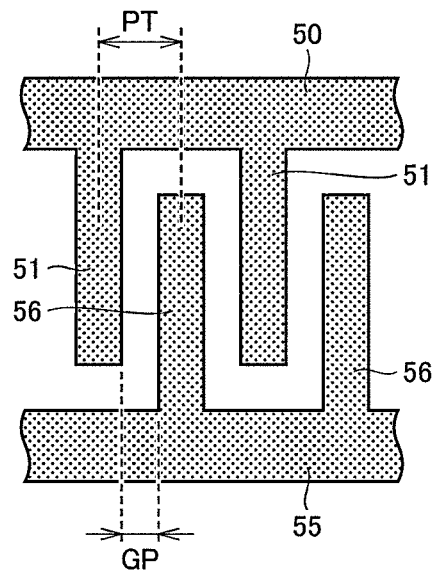
FIG. 5 is a diagram for describing a pitch and an electrode-finger spacing of an IDT electrode.

FIG. 5 is a diagram illustrating a portion of an IDT electrode in an enlarged manner. The IDT electrode has a structure in which two comb-shaped electrodes face each other. Specifically, in one of the comb-shaped electrodes, a plurality of electrode fingers 51 are arranged with a predetermined spacing therebetween at a busbar 50. In the other comb-shaped electrode, a plurality of electrode fingers 56 are arranged with a predetermined spacing therebetween at a busbar 55. The two comb-shaped electrodes are arranged such that the electrode fingers 51 and the electrode fingers 56 face each other in an interdigitating manner. In this case, the center-to-center distance between two adjacent opposing electrode fingers 51 and 56 is a pitch PT, and the distance between end faces of opposing electrode fingers is an electrode-finger spacing GP.

The IDT electrode defines and functions as a capacitor by the opposing electrode fingers as described above. Generally, the capacitance of a capacitor is inversely proportional to the distance between electrodes. Thus, the capacitance of the IDT electrode can be changed by adjusting the electrode-finger spacing GP of the IDT electrode.

In the filter device 30A in FIG. 4, the electrode-finger spacing of the IDT electrode IDT2A is set to be narrower than that of the IDT electrode IDT1A and that of the IDT electrode IDT3A in the series arm resonance unit S10A. By setting the electrode-finger spacings of the IDT electrodes in this manner, even if the number of electrode fingers of the IDT electrode IDT2A is less than the sum of the number of electrode fingers of the IDT electrode IDT1A and the number of electrode fingers of the IDT electrode IDT3A, a capacitance CP2 of the IDT electrode IDT2A can be made higher than the sum of a capacitance CP1 of the IDT electrode IDT1A and a capacitance CP3 of the IDT electrode IDT3A.

Note that, in the second preferred embodiment, similarly to as in the first preferred embodiment, the number of electrode fingers of the IDT electrode IDT2A may be greater than the sum of the number of electrode fingers of the IDT electrode IDT1A and the number of electrode fingers of the IDT electrode IDT3A.

Figures 6, 7:
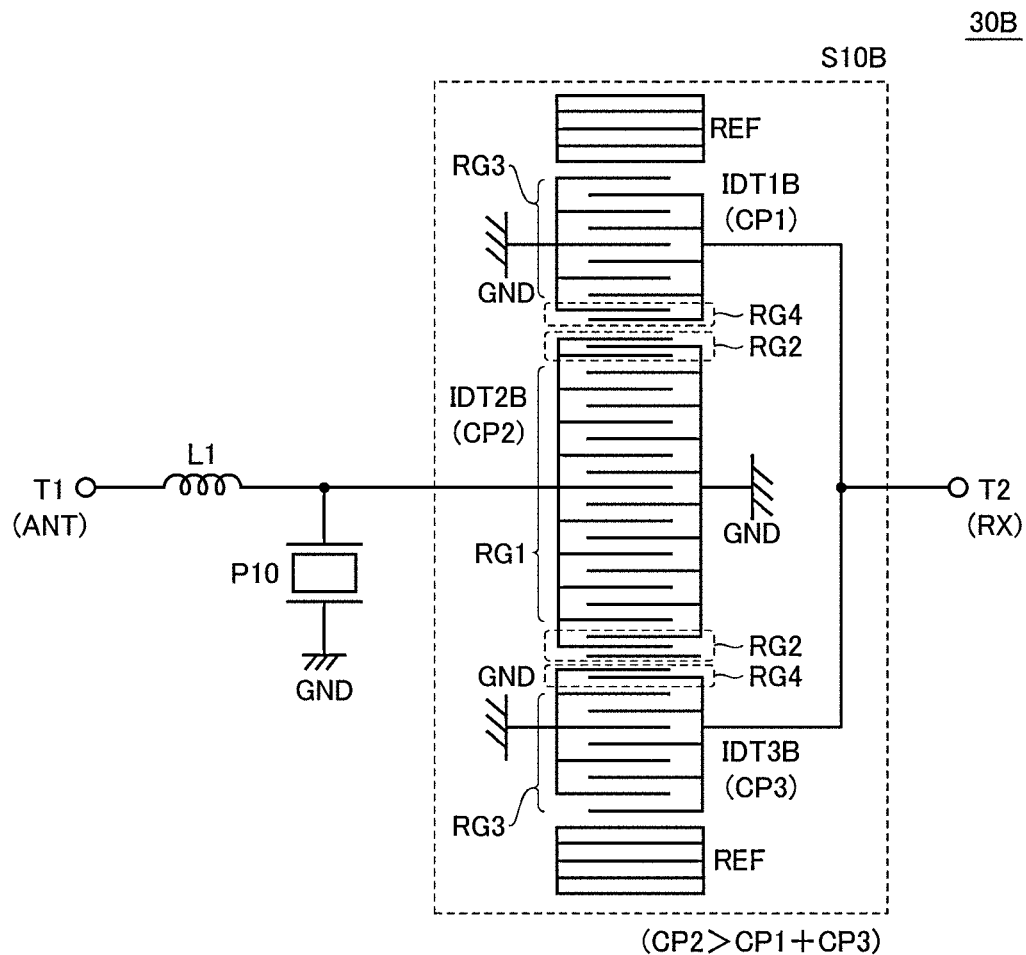
FIG. 6 is a diagram illustrating an example of parameters for a longitudinally coupled resonator acoustic wave resonator in FIG. 4.
FIG. 7 is a diagram for describing an acoustic wave filter device according to a third preferred embodiment the present invention.

FIG. 6 is a diagram illustrating an example of parameters for the longitudinally coupled resonator acoustic wave resonator of the series arm resonance unit S10A in FIG. 4. For each of the IDT electrodes IDT1A and IDT3A in the acoustic wave resonator, preferably, the number of electrode fingers is set to 39, a wavelength (=2PT) is set to about 1.733 μm, and the electrode-finger spacing GP is set to about 0.433 μm, for example. In contrast, for the IDT electrode IDT2A, preferably, the number of electrode fingers is set to 123, a wavelength is set to about 1.7091 μm, and the electrode-finger spacing GP is set to about 0.427 μm, for example.

In this manner, in the longitudinally coupled resonator acoustic wave resonator, the capacitance of the IDT electrode coupled to the antenna terminal can be made higher than the sum of the capacitances of the IDT electrodes coupled to the reception terminal by making the electrode-finger spacing of the IDT electrode coupled to the antenna terminal narrower than the electrode-finger spacings of the IDT electrodes coupled to the reception terminal. Consequently, the inductance of the inductor connected between the antenna terminal and the longitudinally coupled resonator can be reduced, thus reducing the resistive component of the inductor. Thus, the insertion loss of the filter device can be reduced.

Third Preferred Embodiment

It is known that, in a longitudinally coupled resonator acoustic wave resonator, different vibration modes of a signal propagating through IDT electrodes are generated by making the pitch of a portion of electrode fingers of an IDT electrode narrower than the pitch of the other portion of the electrode fingers of the IDT electrode. By generating these modes, the bandpass characteristics of a filter device can be improved.

In contrast, when the pitch of electrode fingers is reduced, the capacitance of the corresponding portion is increased, so that the capacitance of the IDT electrode can be increased.

In a third preferred embodiment of the present invention, the configuration of a filter device will be described with which the insertion loss of the filter device is reduced in a case where a longitudinally coupled resonator acoustic wave resonator includes an IDT electrode having a narrow-pitch portion.

FIG. 7 is a diagram for describing an acoustic wave filter device 30B according to the third preferred embodiment. In the filter device 30B, the series arm resonance unit S10 in FIG. 2 is replaced with a series arm resonance unit S10B. In the filter device 30B, the description of the same or corresponding elements as those in FIG. 2 will not be repeated.

With reference to FIG. 7, similarly to the series arm resonance unit S10 in FIG. 2, the series arm resonance unit S10B is a longitudinally coupled resonator acoustic wave resonator and includes three IDT electrodes IDT1B to IDT3B and reflectors REF.

The IDT electrode IDT2B is connected between the inductor L1 connected to the antenna terminal ANT (the first terminal T1) and the ground potential GND. The IDT electrode IDT1B faces one end of the IDT electrode IDT2B in an excitation direction, and the IDT electrode IDT3B faces the other end of the IDT electrode IDT2B in the excitation direction. The IDT electrodes IDT1B and IDT3B are connected in parallel between the reception terminal RX (the second terminal T2) and the ground potential GND. The reflectors REF are arranged at the sides of the IDT electrodes IDT1B and IDT3B where the IDT electrode IDT2B is not provided so as to face the IDT electrodes IDT1B and IDT3B in the excitation direction.

In the IDT electrode IDT2B, electrode fingers in a region RG1 (a first region) near the center of a surface acoustic wave propagation direction are provided with a first pitch therebetween, and electrode fingers in regions RG2 (second regions), which face the IDT electrodes IDT1B and IDT3B, are provided with a second pitch therebetween, which is shorter than the first pitch. Moreover, in each of the IDT electrodes IDT1B and IDT3B, electrode fingers in a region RG3 (a third region) other than a region RG4 (a fourth region), which faces the IDT electrode IDT2B, are provided with a third pitch therebetween, and electrode fingers in the fourth region are provided with a fourth pitch therebetween, which is shorter than the third pitch. In this manner, different vibration modes are generated for a signal propagating through the IDT electrodes by providing narrow-pitch portions in the IDT electrodes, and the attenuation characteristics of the filter device can be improved.

In the series arm resonance unit S10B, the number of electrode fingers included in the second regions, which are narrow-pitch regions, in the IDT electrode IDT2B is set to be greater than the sum of the numbers of electrode fingers included in the fourth regions, which are narrow-pitch regions, in the IDT electrodes IDT1B and IDT3B. By making the number of electrode fingers in the second regions in the IDT electrode IDT2B on the input side greater than the total number of electrode fingers in the fourth regions in the IDT electrodes IDT1B and IDT3B, it becomes easier to make a capacitance CP2 of the IDT electrode IDT2B higher than the sum of a capacitance CP1 of the IDT electrode IDT1B and a capacitance CP3 of the IDT electrode IDT3B. Consequently, the inductance of the inductor L1 can be reduced, and the resistive component of the inductance of the inductor L1 can be reduced. Thus, in the filter device 30B, the impedance for signals outside the pass band can be maintained while reducing the resistive component of the inductor and reducing or preventing an increase in the insertion loss.

Note that the pitch does not always have to be constant in the second regions in the IDT electrode IDT2B and in the fourth regions in the IDT electrodes IDT1B and IDT3B. That is, the pitch in the second regions may be reduced gradually or in stages from the first pitch to the second pitch. The pitch in the fourth regions may also be reduced gradually or in stages from the third pitch to the fourth pitch.

FIG. 8 is a diagram illustrating an example of parameters for the longitudinally coupled resonator acoustic wave resonator of the series arm resonance unit S10B in FIG. 7. For each of the IDT electrodes IDT1B and IDT3B in the acoustic wave resonator, preferably, a wavelength (=2PT) in a main region is set to about 1.733 μm, and a wavelength in a narrow-pitch region facing the IDT electrode IDT2B is set to about 1.5884 μm, for example. In each of the IDT electrodes IDT1B and IDT3B, preferably, the total number of electrode fingers is 40, and the number of electrode fingers included in the narrow-pitch region is 6 out of 40, for example.

In contrast, for the IDT electrode IDT2B, for example, a wavelength in a main region is set to about 1.7091 μm, and a wavelength in narrow-pitch regions at both ends is set to about 1.6125 μm, for example. Preferably, the total number of electrode fingers is 125, and the number of electrode fingers included in each narrow-pitch region is 9 out of 125, for example. That is, preferably, the total number of electrode fingers in the narrow-pitch regions is 18 in the IDT electrode IDT2B, and the total number of electrode fingers in the narrow-pitch regions is 12 in the IDT electrodes IDT1B and IDT3B, for example.

In this manner, in the longitudinally coupled resonator acoustic wave resonator, the capacitance of the IDT electrode coupled to the antenna terminal can be made higher than the sum of the capacitances of the IDT electrodes coupled to the reception terminal by making the total number of electrode fingers in the narrow-pitch regions in the IDT electrode coupled to the antenna terminal greater than the total number of electrode fingers in the narrow-pitch regions in the IDT electrodes coupled to the reception terminal. Consequently, the inductance of the inductor connected between the antenna terminal and the longitudinally coupled resonator can be reduced, thus reducing the resistive component of the inductor. Thus, the insertion loss of the filter device can be reduced.

Modifications

In each preferred embodiment described above, the configuration of the longitudinally coupled resonator acoustic wave resonator has been described in which one IDT electrode is coupled to the input side (the antenna terminal ANT side) and two IDT electrodes are coupled to the output side (the reception terminal RX side), the longitudinally coupled resonator acoustic wave resonator being included in the filter device on the reception side. However, the configuration of the longitudinally coupled resonator acoustic wave resonator is not limited thereto, and a longitudinally coupled resonator acoustic wave resonator having another configuration may be used. In the following, modifications of the longitudinally coupled resonator acoustic wave resonator according to preferred embodiments of the present invention will be described.

First Modification

Figure 9:
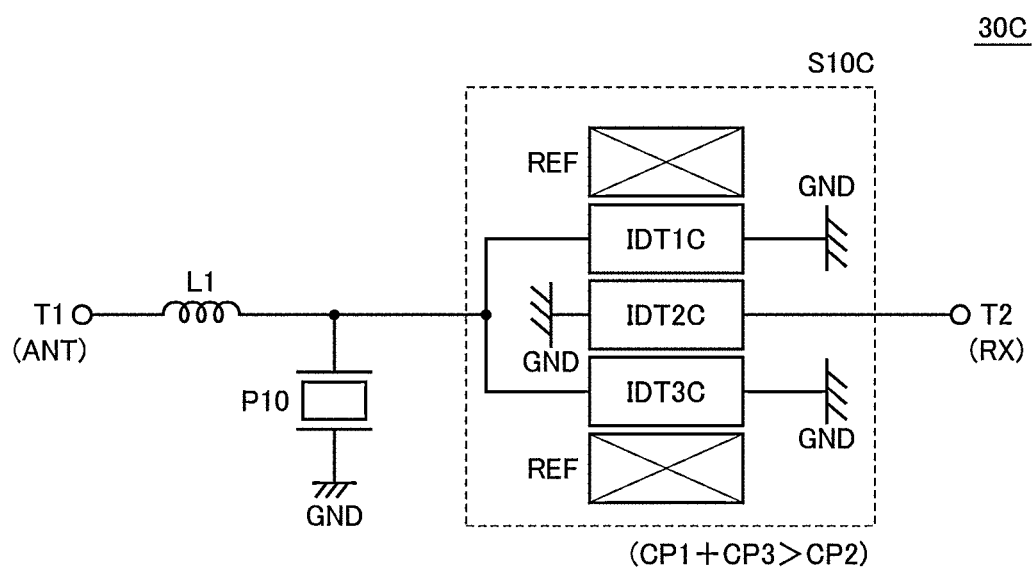
FIG. 9 is a diagram illustrating a circuit configuration of an acoustic wave filter device according to a first modification of a preferred embodiment of the present invention.

FIG. 9 is a diagram illustrating a circuit configuration of an acoustic wave filter device 30C according to a first modification of a preferred embodiment of the present invention. With reference to FIG. 9, the filter device 30C has a configuration in which the series arm resonance unit S10 of the filter device 30 of the first preferred embodiment in FIG. 2 is replaced with a series arm resonance unit S10C.

The series arm resonance unit S10C has a configuration in which three IDT electrodes IDT1C to IDT3C and reflectors REF are arranged similarly to as in the series arm resonance unit S10 in FIG. 2. However, the IDT electrodes are coupled to the input and the output in an opposite manner. More specifically, the IDT electrodes IDT1C and IDT3C are connected in parallel between the inductor L1 connected to the antenna terminal ANT (the first terminal T1) and the ground potential GND. The IDT electrode IDT2C is connected between the reception terminal RX (the second terminal T2) and the ground potential GND.

In the series arm resonance unit S10C, parameters for each IDT electrode are set such that the sum of a capacitance CP1 of the IDT electrode IDT1C and a capacitance CP3 of the IDT electrode IDT3C is higher than a capacitance CP2 of the IDT electrode IDT2C. Consequently, the inductance of the inductor L1 connected between the antenna terminal ANT and the series arm resonance unit S10C can be reduced. Thus, in the filter device 30C, the impedance for signals outside the pass band can be maintained while reducing the resistive component of the inductor L1 and reducing or preventing an increase in the insertion loss.

Second Modification

Figure 10:
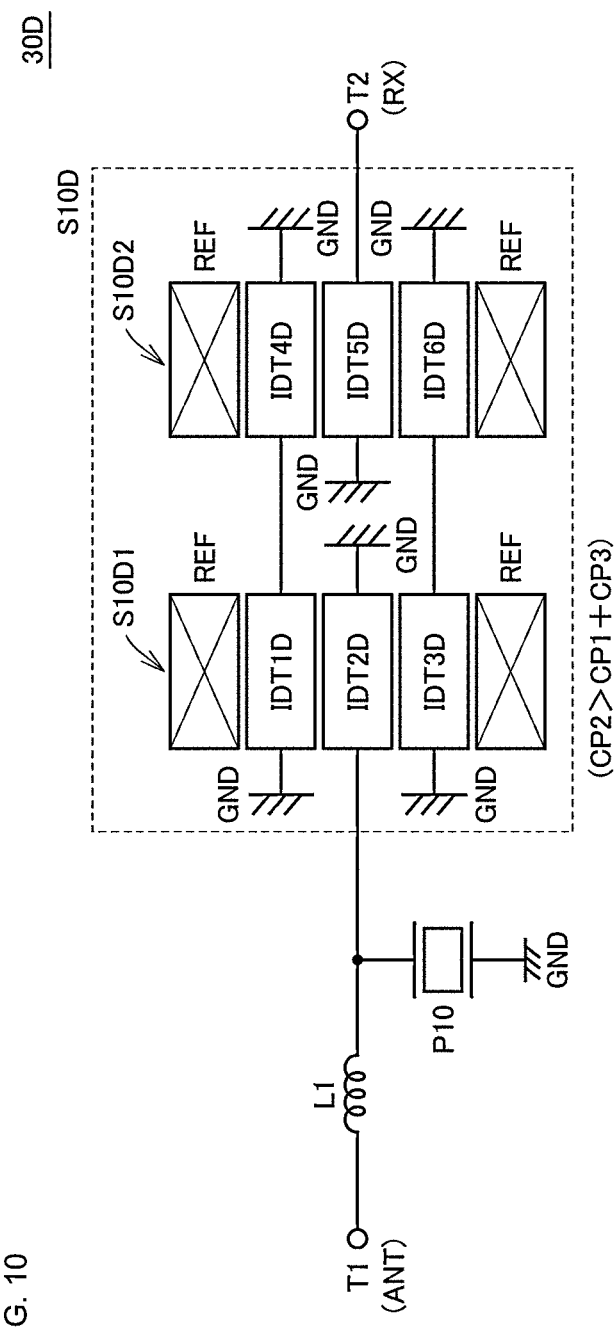
FIG. 10 is a diagram illustrating a circuit configuration of an acoustic wave filter device according to a second modification of a preferred embodiment of the present invention.

FIG. 10 is a diagram illustrating a circuit configuration of an acoustic wave filter device 30D according to a second modification of a preferred embodiment of the present invention. With reference to FIG. 10, a series arm resonance unit S10D in the filter device 30D has a configuration in which two 3-IDT, longitudinally coupled resonator acoustic wave resonators are connected in series. In other words, the series arm resonance unit S10D has a configuration in which a longitudinally coupled resonator S10D1 and a longitudinally coupled resonator S10D2 are connected in series, the longitudinally coupled resonator S10D1 corresponding to the series arm resonance unit S10 illustrated in FIG. 2, the longitudinally coupled resonator S10D2 corresponding to the series arm resonance unit S10C illustrated in FIG. 9.

More specifically, the longitudinally coupled resonator S10D1 includes three IDT electrodes IDT1D to IDT3D and reflectors REF, and the IDT electrodes IDT1D and IDT3D are arranged on both sides of the IDT electrode IDT2D. The longitudinally coupled resonator S10D2 includes three IDT electrodes IDT4D to IDT6D and reflectors REF, and the IDT electrodes IDT4D and IDT6D are arranged on both sides of the IDT electrode IDT5D.

In the longitudinally coupled resonator S10D1, the IDT electrode IDT2D is connected between the inductor L1 connected to the antenna terminal ANT (the first terminal T1) and the ground potential GND. The IDT electrode IDT1D of the longitudinally coupled resonator S10D1 and the IDT electrode IDT4D of the longitudinally coupled resonator S10D2 are connected in series between the ground potentials GND. Moreover, the IDT electrode IDT3D of the longitudinally coupled resonator S10D1 and the IDT electrode IDT6D of the longitudinally coupled resonator S10D2 are connected in series between the ground potentials GND. The IDT electrode IDT5D of the longitudinally coupled resonator S10D2 is connected between the reception terminal RX (the second terminal T2) and the ground potential GND.

In the series arm resonance unit S10D, parameters for each IDT electrode are set such that a capacitance CP2 of the IDT electrode IDT2D on the input side is higher than the sum of a capacitance CP1 of the IDT electrode IDT1D and a capacitance CP3 of the IDT electrode IDT3D in the longitudinally coupled resonator S10D1. Consequently, the inductance of the inductor L1 connected between the antenna terminal ANT and the series arm resonance unit S10D can be reduced. Thus, in the filter device 30D, the impedance for signals outside the pass band can be maintained while reducing the resistive component of the inductor L1 and reducing or preventing an increase in the insertion loss. In this manner, in the series arm resonance unit having a configuration in which the plurality of longitudinally coupled resonators are connected in series, it is sufficient that the capacitance CP2 of the IDT electrode IDT2D on the input side is higher than the sum of the capacitance CP1 of the IDT electrode IDT1D and the capacitance CP3 of the IDT electrode IDT3D on the output side in the longitudinally coupled resonator S10D1, which is the closest to the inductor L1.

Third Modification

Figure 11:
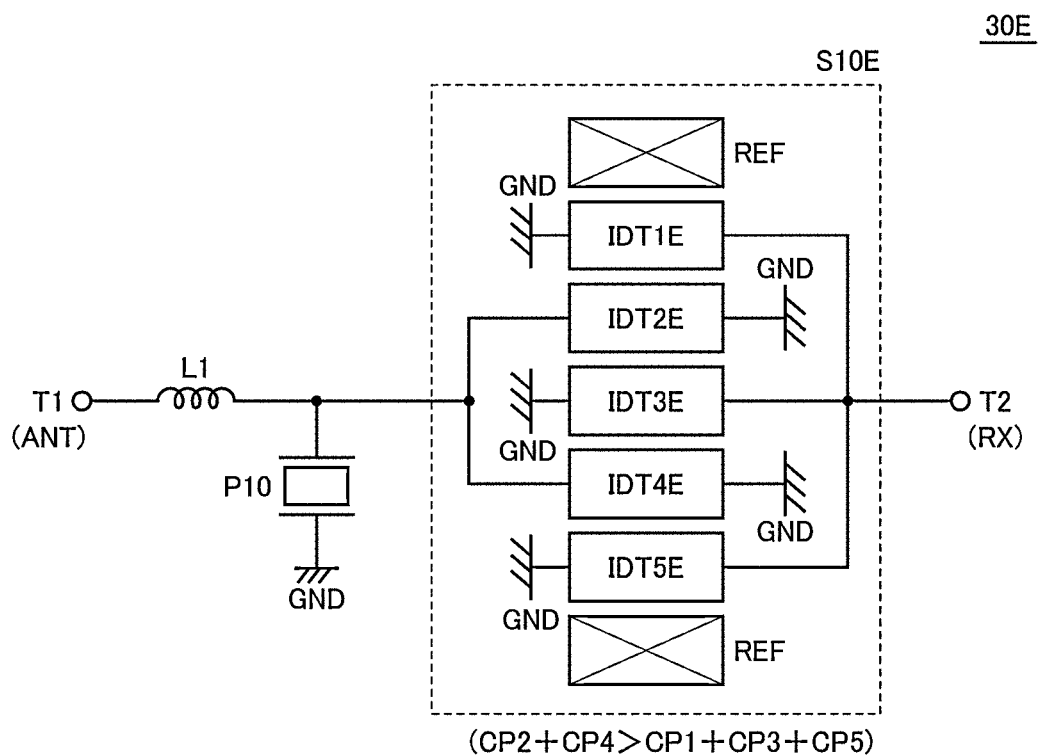
FIG. 11 is a diagram illustrating a circuit configuration of an acoustic wave filter device according to a third modification of a preferred embodiment of the present invention.

FIG. 11 is a diagram illustrating a circuit configuration of an acoustic wave filter device 30E according to a third modification of a preferred embodiment of the present invention. With reference to FIG. 11, a series arm resonance unit S10E in the filter device 30E has a configuration including a 5-IDT, longitudinally coupled resonator acoustic wave resonator. More specifically, the series arm resonance unit S10E includes five IDT electrodes IDT1E to IDT5E and two reflectors REF.

In the series arm resonance unit S10E, the IDT electrodes IDT1E to IDT5E are arranged in this order between the two reflectors REF. The IDT electrodes IDT2E and IDT4E are connected in parallel between the inductor L1 connected to the antenna terminal ANT (the first terminal T1) and the ground potential GND. The IDT electrodes IDT1E, IDT3E, and IDT5E are connected in parallel between the reception terminal RX (the second terminal T2) and the ground potential GND.

In the series arm resonance unit S10E, parameters for each IDT electrode are set such that the sum of a capacitance CP2 of the IDT electrode IDT2E and a capacitance CP4 of the IDT electrode IDT4E becomes higher than the sum of a capacitance CP1 of the IDT electrode IDT1E, a capacitance CP3 of the IDT electrode IDT3E, and a capacitance CP5 of the IDT electrode IDT5E. Consequently, the inductance of the inductor L1 connected between the antenna terminal ANT and the series arm resonance unit S10E can be reduced. Thus, in the filter device 30E, the impedance for signals outside the pass band can be maintained while reducing the resistive component of the inductor L1 and reducing or preventing an increase in the insertion loss.

Note that, in the longitudinally coupled resonators of preferred embodiments of the present invention, an IDT electrode or IDT electrodes connected to the input side (the first-terminal side) correspond to "at least one first IDT electrode". Moreover, an IDT electrode or IDT electrodes connected to the output side (the second-terminal side) correspond to "at least one second IDT electrode".

The preferred embodiments disclosed herein are examples in all respects and are not considered to be limiting. The scope of the present invention is indicated not by the detailed description of the preferred embodiments described above but by the claims and is intended to include all modifications within the scope of the claims and the scope of equivalents for the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a first terminal;
   a second terminal;
   an inductor connected to the first terminal; and
   a longitudinally coupled resonator coupled between the inductor and the second terminal; wherein
   the longitudinally coupled resonator includes:
      at least one first IDT electrode coupled to the first terminal; and
      at least one second IDT electrode connected to the second terminal;
   a total capacitance value of the at least one first IDT electrode is greater than a total capacitance value of the at least one second IDT electrode;
   each IDT electrode of the at least one first IDT electrode includes a first region in which electrode fingers are provided with a first pitch therebetween and a second region in which electrode fingers are provided with a second pitch therebetween, which is shorter than the first pitch;
   each IDT electrode of the at least one second IDT electrode includes a third region in which electrode fingers are provided with a third pitch therebetween and a fourth region in which electrode fingers are provided with a fourth pitch therebetween, which is shorter than the third pitch;

the second region faces the fourth region; and
a number of electrode fingers adjacent to each other with the second pitch therebetween in the second region is greater than a number of electrode fingers adjacent to each other with the fourth pitch therebetween in the fourth region.

2. The acoustic wave filter device according to claim 1, wherein a total number of electrode fingers of the at least one first IDT electrode is greater than a total number of electrode fingers of the at least one second IDT electrode.

3. The acoustic wave filter device according to claim 1, wherein the at least one first IDT electrode includes an IDT electrode including a number of electrode fingers greater than a number of electrode fingers of each of the at least one second IDT electrode.

4. The acoustic wave filter device according to claim 1, wherein a number of electrode fingers of each IDT electrode included in the at least one first IDT electrode is greater than a number of electrode fingers of each IDT electrode included in the at least one second IDT electrode.

5. The acoustic wave filter device according to claim 1, wherein an electrode-finger-to-electrode-finger distance of the at least one first IDT electrode is shorter than an electrode-finger-to-electrode-finger distance of each of the at least one second IDT electrode.

6. The acoustic wave filter device according to claim 1, wherein the longitudinally coupled resonator is an acoustic wave resonator.

7. The acoustic wave filter device according to claim 1, further comprising a resonator connected between a connection node between the inductor and the longitudinally coupled resonator and a ground potential.

8. A multiplexer comprising:
the acoustic wave filter device according to claim 1.

9. An acoustic wave filter device comprising:
a first terminal;
a second terminal;
an inductor connected to the first terminal; and
a longitudinally coupled resonator coupled between the inductor and the second terminal; wherein
the longitudinally coupled resonator includes:
  at least one first IDT electrode coupled to the first terminal; and
  at least one second IDT electrode connected to the second terminal;
a total area of an intersecting region of electrode fingers of the at least one first IDT electrode is larger than a total area of an intersecting region of electrode fingers of the at least one second IDT electrode;
each IDT electrode of the at least one first IDT electrode includes a first region in which electrode fingers are provided with a first pitch therebetween and a second region in which electrode fingers are provided with a second pitch therebetween, which is shorter than the first pitch;
each IDT electrode of the at least one second IDT electrode includes a third region in which electrode fingers are provided with a third pitch therebetween and a fourth region in which electrode fingers are provided with a fourth pitch therebetween, which is shorter than the third pitch;
the second region faces the fourth region; and
a number of electrode fingers adjacent to each other with the second pitch therebetween in the second region is greater than a number of electrode fingers adjacent to each other with the fourth pitch therebetween in the fourth region.

10. The multiplexer according to claim 8, further comprising:
a third terminal; and
a filter device between the first terminal and the third terminal.

11. The acoustic wave filter device according to claim 9, wherein a total number of electrode fingers of the at least one first IDT electrode is greater than a total number of electrode fingers of the at least one second IDT electrode.

12. The acoustic wave filter device according to claim 9, wherein the at least one first IDT electrode includes an IDT electrode including a number of electrode fingers greater than a number of electrode fingers of each of the at least one second IDT electrode.

13. The acoustic wave filter device according to claim 9, wherein a number of electrode fingers of each IDT electrode included in the at least one first IDT electrode is greater than a number of electrode fingers of each IDT electrode included in the at least one second IDT electrode.

14. The acoustic wave filter device according to claim 9, wherein an electrode-finger-to-electrode-finger distance of the at least one first IDT electrode is shorter than an electrode-finger-to-electrode-finger distance of each of the at least one second IDT electrode.

15. The acoustic wave filter device according to claim 9, wherein the longitudinally coupled resonator is an acoustic wave resonator.

16. The acoustic wave filter device according to claim 9, further comprising a resonator connected between a connection node between the inductor and the longitudinally coupled resonator and a ground potential.

17. A multiplexer comprising:
the acoustic wave filter device according to claim 9.

18. The multiplexer according to claim 17, further comprising:
a third terminal; and
a filter device between the first terminal and the third terminal.

* * * * *